(12) United States Patent
Xue et al.

(10) Patent No.: US 11,303,246 B1
(45) Date of Patent: Apr. 12, 2022

(54) VOLTAGE CONTROLLED OSCILLATION DEVICE AND WIRELESS TRANSCEIVER

(71) Applicant: SOUTH CHINA UNIVERSITY OF TECHNOLOGY, Guangzhou (CN)

(72) Inventors: Quan Xue, Guangzhou (CN); Chao Li, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/354,620

(22) Filed: Jun. 22, 2021

(30) Foreign Application Priority Data

Nov. 11, 2020 (CN) .......................... 202011254889.8

(51) Int. Cl.
*H03B 5/12* (2006.01)
*H04B 1/40* (2015.01)
*H03B 5/30* (2006.01)

(52) U.S. Cl.
CPC ......... *H03B 5/1253* (2013.01); *H03B 5/1228* (2013.01); *H03B 5/30* (2013.01); *H04B 1/40* (2013.01)

(58) Field of Classification Search
CPC ...... H03B 5/00; H03B 5/1253; H03B 5/1228; H03B 5/30; H04B 1/40
USPC ................... 331/167, 179, 116 FE; 455/260; 336/137
See application file for complete search history.

(56) References Cited

U.S. PATENT DOCUMENTS 8,779,865 B2 * 7/2014 Ainspan .................. H03L 7/099
331/117 FE

FOREIGN PATENT DOCUMENTS

WO    WO-2012054826 A1 *  4/2012 ........... H03B 5/1212

\* cited by examiner

*Primary Examiner* — Arnold M Kinkead
(74) *Attorney, Agent, or Firm* — Seyfarth Shaw LLP (57) ABSTRACT

The present disclosure provides a voltage controlled oscillation device and a wireless transceiver. The voltage controlled oscillation device includes a resonator, an oscillation core circuit, a switch circuit and a control device. The oscillation core circuit is configured to provide signals of different phases to the resonator. The resonator is configured to generate a plurality of different resonance frequencies. The control device is configured to control the connection/disconnection among ends of the resonator through controlling the switch circuit to be on/off, so that the resonator retains two resonance frequencies from the plurality of different resonance frequencies. The control device is further configured to change the retained two resonance frequencies by controlling the switch circuit to be turn on/off. The resonator is further configured to process two resonance frequencies under action of oscillation core circuit, and output a fundamental signal of one resonance frequency.

11 Claims, 7 Drawing Sheets

VOLTAGE CONTROLLED OSCILLATION DEVICE AND WIRELESS TRANSCEIVER

CROSS REFERENCE TO RELATED APPLICATIONS

This application claims priority to Chinese Patent Application No. 2020112548898, filed on Nov. 11, 2020, which is incorporated herein by reference in its entirety.

TECHNICAL FIELD

The present disclosure relates to the technical field of wireless communications, and more particularly, to a voltage controlled oscillation device and a wireless transceiver.

BACKGROUND

Modern wireless transceivers requires an up-conversion mixing and a down-conversion mixing for a baseband signal by using an oscillation signal, and a most popular method is to use a cross-coupled voltage controlled oscillator of an LC resonator to generate the oscillation signal. Main performance indexes of the voltage controlled oscillator are phase noise and tuning bandwidth. The phase noise is mainly determined by a quality factor and a power consumption of a load resonance network, and the tuning bandwidth is mainly determined by a ratio of a capacitance value of a variable capacitance part in load capacitance to a total capacitance value. Generally, both indexes of the phase noise and the tuning bandwidth are constrained to each other.

The conventional cross-coupled voltage controlled oscillator cannot guarantee a reduction in phase noise with an increase in tuning range.

SUMMARY

Based on the above, it is necessary to provide a voltage controlled oscillation device and a wireless transceiver in view of the above technical problems.

According to an aspect of the present disclosure, a voltage controlled oscillation device is provided, including a resonator, an oscillation core circuit, a switch circuit and a control device. The oscillation core circuit is configured to provide signals of different phases to the resonator; the resonator is configured to generate a plurality of different resonance frequencies; the control device is configured to control connection/disconnection among ends of the resonator through controlling the switch circuit to be turned on/off, so that the resonator retains two resonance frequencies from the plurality of different resonance frequencies; the control device is further configured to change the retained two resonance frequencies by controlling the switch circuit to be turned on/off; and the resonator is further configured to process the two resonance frequencies under action of the oscillation core circuit, and output a fundamental signal of one resonance frequency.

In an embodiment, the oscillation core circuit includes: a first oscillation core sub-circuit and a second oscillation core sub-circuit. A first output end of the first oscillation core sub-circuit is connected to a first input end of the resonator, a second output end of the first oscillation core sub-circuit is connected to a second input end of the resonator, a first input end of the first oscillation core sub-circuit is connected to a first output end of the resonator, and a second input end of the first oscillation core sub-circuit is connected to a second output end of the resonator. A first output end of the second oscillation core sub-circuit is connected to a third input end of the resonator, a second output end of the second oscillation core sub-circuit is connected to a fourth input end of the resonator, a first input end of the second oscillation core sub-circuit is connected to a third output end of the resonator, and a second input end of the second oscillation core sub-circuit is connected to a fourth output end of the resonator.

In an embodiment, the first oscillation core sub-circuit includes: a current source, a first end of the current source being grounded; a first field effect transistor, a gate of the first field effect transistor being connected to the first output end of the resonator, a source of the first field effect transistor being connected to a second end of the current source, and a drain of the first field effect transistor being connected to the first input end of the resonator; and a second field effect transistor, a gate of the second field effect transistor being connected to the second output end of the resonator, a source of the second field effect transistor being connected to the second end of the current source, and a drain of the second field effect transistor being connected to the second input end of the resonator.

In an embodiment, the first field effect transistor and the second field effect transistor are both N-channel field effect transistors.

In an embodiment, the resonator includes: a first resonance circuit, a first end of the first resonance circuit being connected to the first input end of the second oscillation core sub-circuit, a second end of the first resonance circuit being connected to the first output end of the first oscillation core sub-circuit, and a third end of the first resonance circuit being configured to be connected to a power supply; a second resonance circuit, a first end of the second resonance circuit being connected to the second input end of the second oscillation core sub-circuit, a second end of the second resonance circuit being connected to the second output end of the first oscillation core sub-circuit, and a third end of the second resonance circuit being configured to be connected to the power supply; a third resonance circuit, a first end of the third resonance circuit being connected to the first input end of the first oscillation core sub-circuit, a second end of the third resonance circuit being connected to the first output end of the second oscillation core sub-circuit, and a third end of the third resonance circuit being configured to be connected to the power supply; and a fourth resonance circuit, a first end of the fourth resonance circuit being connected to the second input end of the first oscillation core sub-circuit, a second end of the fourth resonance circuit being connected to the second output end of the second oscillation core sub-circuit, and a third end of the fourth resonance circuit being configured to be connected to the power supply.

In an embodiment, the first resonance circuit includes: a first inductor, a first end of the first inductor being connected to the first input end of the second oscillation core sub-circuit; a second inductor, a first end of the second inductor being connected to the first output end of the first oscillation core sub-circuit, and a second end of the second inductor being connected to a second end of the first inductor; a third inductor, a first end of the third inductor being connected to the second end of the second inductor, and a second end of the third inductor being configured to be connected to the power supply; a first capacitor, a first end of the first capacitor being connected to the first end of the first inductor, and a second end of the first capacitor being grounded; and a second capacitor, a first end of the second capacitor being connected to the first end of the second inductor, and a second end of the second capacitor being grounded.

In an embodiment, the switch circuit includes: a first switch sub-circuit, a first input end of the first switch sub-circuit being connected to a third output end of the resonator, a second input end of the first switch sub-circuit being connected to a fourth output end of the resonator, a first output end of the first switch sub-circuit being connected to a first output end of the resonator, a second output end of the first switch sub-circuit being connected to a second output end of the resonator, and a control end of the first switch sub-circuit being connected to the control device; and a second switch sub-circuit, a first input end of the second switch sub-circuit being connected to a first input end of the resonator, a second input end of the second switch sub-circuit being connected to a second input end of the resonator, a second output end of the second switch sub-circuit being connected to a third input end of the resonator, a second output end of the second switch sub-circuit being connected to a fourth input end of the resonator, and a control end of the second switch sub-circuit being connected to the control device.

In an embodiment, the first switch sub-circuit includes: a third field effect transistor, a gate of the third field effect transistor being connected to the control device, a drain of the third field effect transistor being connected to the third output end of the resonator, and the source of the third field effect transistor being connected to the first output end of the resonator; a fourth field effect transistor, a gate of the field effect transistor being connected to the control device, a drain of the field effect transistor being connected to the fourth output end of the resonator, and a source of the field effect transistor being connected to the second output end of the resonator; an inverter, an input end of the inverter being connected to the control device; a fifth field effect transistor, a gate of the fifth field effect transistor being connected to an output end of the inverter, a drain of the fifth field effect transistor being connected to the third output end of the resonator, and a source of the fifth field effect transistor being connected to the second output end of the resonator; and a sixth field effect transistor, a gate of the sixth field effect transistor being connected to the output end of the inverter, a drain of the sixth field effect transistor being connected to the fourth output end of the resonator, and a source of the sixth field effect transistor being connected to the first output end of the resonator.

In an embodiment, the third field effect transistor, the fourth field effect transistor, the fifth field effect transistor and the sixth field effect transistor are all P-channel field effect transistors.

According to another aspect of the present disclosure, a wireless transceiver is provided, including the voltage controlled oscillation device according to the above aspect.

According to embodiments of the present disclosure, a voltage controlled oscillation device is provided. The voltage controlled oscillation device includes a resonator, an oscillation core circuit, a switch circuit and a control device. The oscillation core circuit is configured to provide signals of different phases to the resonator; the resonator is configured to generate a plurality of different resonance frequencies; the control device is configured to control the connection/disconnection among ends of the resonator by controlling the switch circuit to be turned on/off, so that the resonator retains two resonance frequencies from a plurality of different resonance frequencies. The control device is further configured to change the retained two resonance frequencies by controlling the switch circuit to be turned on/off. The resonator is configured to process the two resonance frequencies under action of the oscillation core circuit, and output a fundamental signal of one resonance frequency. The voltage controlled oscillation device provided in the embodiments can control the switch circuit to be turned on/off through the control device, to make the resonator retain two resonance frequencies from a plurality of different resonance frequencies, and can change the retained two resonance frequencies, to improve the tuning range of the voltage controlled oscillation device. Meanwhile, under action of the oscillation core circuit, the resonance frequency of the resonance peak corresponding to the high order harmonic wave can be suppressed by the resonator, so that the resonance frequency at high order harmonic wave in the signal output through the resonator is suppressed, and only the resonance frequency at the fundamental wave is retained, thereby reducing the phase noise of the signal output from the resonator.

BRIEF DESCRIPTION OF THE DRAWINGS

To describe the technical solutions in the embodiments of the present disclosure or in the conventional technology more clearly. The following briefly introduces the figures required for describing the embodiments or the conventional technology. Obviously, the figures in the following description are merely some embodiments of the present disclosure. For a person skilled in the art, without involving any inventive effort, other figures may also be obtained from these figures.

DESCRIPTION OF REFERENCE NUMERALS 10, voltage controlled oscillation device;
100, resonator;
110, first resonance circuit;
120, second resonance circuit;
130, third resonance circuit;
140, fourth resonance circuit;
200, oscillation core circuit;
210, first oscillation core;
211, current source;
220, second oscillation core;
300, switch circuit;
310, first switch sub-circuit;
311, inverter;
320, second switch sub-circuit; and
400, control device.

DETAILED DESCRIPTION OF THE EMBODIMENTS

In order to make the above objects, features and advantages of the present disclosure more apparent, the specific embodiments of the present disclosure will be described in detail below with reference to the accompanying drawings. Many specific details are set forth in the following description to facilitate a sufficient understanding of the present disclosure. However, the present disclosure can be embodied in many other manners different from those described herein, and those skilled in the art can make similar improvements without departing from the scope of the present disclosure, and therefore the present disclosure is not limited by the specific embodiments disclosed below.

The technical solutions of the present disclosure and the technical solutions of the present disclosure will be described in detail below with reference to specific embodiments. The following specific embodiments may be combined with each other, and the same or similar concepts or processes may be omitted in some embodiments. Hereinafter, embodiments of the present disclosure will be described with reference to the accompanying drawings.

Herein, the serial numbers themselves, such as "first", "second", etc., are used to distinguish the described objects, without any order or technical meaning. The terms "connect" and "couple" in the present disclosure include direct and indirect connection (coupling) as no special description. In the description of the present disclosure, it should be understood that the azimuth or positional relationship indicated by the terms "upper", "lower", "front", "rear", "left", "right", "vertical", "horizontal", "top", "bottom", "inner", "outer", "clockwise", and "counterclockwise" is based on the azimuth or positional relationship shown in the figures. Only for the convenience of description of the present disclosure and simplified description. Instead of indicating or implying that the indicated device or element must have a particular orientation, be constructed and operated in a particular orientation, It is therefore not to be construed as limiting the present disclosure.

In the present disclosure, unless expressly specified and defined otherwise, the first feature "upper" or "lower" in the second feature may be that the first and second features are in direct contact, or the first and second features are separated by an intermediate medium. Moreover, the first feature "above", "on", and "over" the second feature may be that the first feature is directly above or obliquely above the second feature, or merely indicate that the first feature level is higher than the second feature. The first feature is "below", "under", and "beneath" the second feature may be that the first feature is directly below or obliquely below the second feature, or merely represents that the level of the first feature is less than that of the second feature.

The voltage controlled oscillation device provided in the present disclosure can be applied to various types of communication systems, for example, the voltage controlled oscillation device can be applied to a transceiver in a wireless communication system. The voltage controlled oscillation device generates an oscillation signal for and up-conversion mixing and down-conversion mixing.

Figure 1:
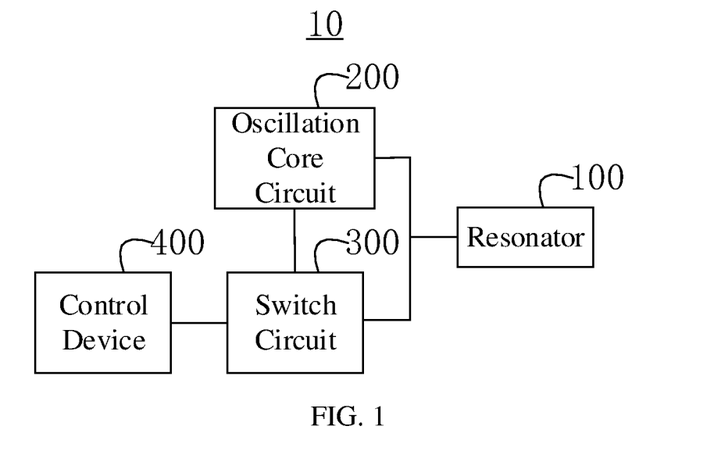
FIG. 1 is a schematic structural diagram illustrating a voltage controlled oscillation device according to an embodiment of the present disclosure.

Referring to FIG. 1, an embodiment of the present disclosure provides a voltage controlled oscillation device 10. The voltage controlled oscillation device 10 includes a resonator 100, an oscillation core circuit 200, a switch circuit 300 and a control device 400. The oscillation core circuit 200 is configured to provide signals of different phases to the resonator 100, and can generate a negative impedance that counteracts a loss of the resonator 100, thereby maintaining a stable output of the signal. The resonator 100 is configured to generate a plurality of different resonance frequencies. The control device 400 is configured to control connection/disconnection among ends of the resonator 100 by controlling the switch circuit 300 to be turned on/off, so that the resonator 100 retains two resonance frequencies from a plurality of different resonance frequencies. The control device 400 is further configured to change the retained two resonance frequencies by controlling the switch circuit 300 to be turned on/off. The resonator 100 is configured to process the two resonance frequencies under action of the oscillation core circuit 200, and output a fundamental signal of one resonance frequency.

The resonator 100 refers to an electronic component capable of generating a resonance frequency, and the resonator 100 has characteristics such as stabilization and good anti-interference performance, and the like. The type and structure of the resonator 100 are not limited in this embodiment, as long as the function thereof can be realized. The oscillation core circuit 200 may include a plurality of output ends and input ends. The resonator 100 may include a plurality of output ends and input ends, and the plurality of input ends and output ends of the oscillation core circuit 200 are respectively connected to the plurality of output ends and input ends of the resonator 100 for providing signals of different phases to the resonator 100. Meanwhile, the oscillation core circuit 200 may generate a negative impedance, so as to counteract the impedance in the resonator 100, so that the resonator 100 can stably generate a resonance frequency, and then a stable signal can be obtained through the resonator 100. The oscillation core circuit 200 may include a plurality of oscillation core sub-circuits, and the type and structure of the oscillation core circuit 200 are not limited in this embodiment, as long as the function thereof can be realized. In a particular embodiment, the two resonance frequencies retained are in a relationship of 1:2 or 1:3. Furthermore, under action of the oscillation core circuit 200, the resonator 100 will retain the low-frequency resonance frequency in the two resonance frequencies and suppress the high-frequency resonance frequency in the two resonance frequencies, which is more advantageous for reducing the phase noise of the signal output through the resonator 100.

The switch circuit 300 may include an input end, an output end, and a control end. The input end and the output end of the switch circuit 300 are respectively connected to a plurality of input ends of the resonator 100, and the control end of the switch circuit 300 is connected to the control device 400. The control device 400 can control the switch circuit 300 to be turned on/off through the control end, and further control the connection/disconnection among the plurality of input ends of the resonator 100, so that the resonator 100 generates different resonance frequencies. The switch circuit 300 may include a plurality of switch sub-circuits, and the structure of the switch circuit 300 is not limited in this embodiment, as long as the function thereof can be realized. The control device 400 may be a computer device or a control chip, and the computer device may be, but is not limited to, various industrial computers, notebook computers, smart phones, tablet computers, and portable wearable devices. The control device 400 controls the switch circuit 300 to be turned on/off, so that the resonator 100 retains two resonance frequencies from a plurality of different resonance frequencies, and suppresses other resonance frequencies. Then, under action of the oscillation core circuit 200, the resonator 100 suppresses the resonance frequency corresponding to the high order harmonic wave according to the transmission characteristic of the resonator 100, so that only one fundamental signal of the resonance frequency is retained in the signal output by the resonator 100. The harmonic wave may be a second harmonic wave or a third harmonic wave, which is not limited in this embodiment. Meanwhile, the retained two resonance frequencies can be changed by controlling the switch circuit 300 to be turned on/off through the control device 400. In other words, the control device 400 may enable the resonator 100 to retain any two of a plurality of different resonance frequencies by controlling the switch circuit 300 to be turned on/off.

In a specific embodiment, firstly, signals of different phases are provided to the resonator 100 by the oscillation core circuit 200, so as to realize coarse adjustment of the resonance frequency of the resonator 100, and then fine adjustment of the resonance frequency of the resonator 100 is realized by changing the value of each element inside the resonator 100.

The voltage controlled oscillation device 10 provided in this embodiment includes a resonator 100, an oscillation core circuit 200, a switch circuit 300, and a control device 400. The oscillation core circuit 200 is configured to provide signals of different phases to the resonator 100. The resonator 100 is configured to generate a plurality of different resonance frequencies. The control device 400 is configured to control the connection/disconnection among the ends of the resonator 100 through the controlling the switch circuit 300 to be turned on/off, so that the resonator retains two resonance frequencies from a plurality of different resonance frequencies. The resonator 100 is configured to process two resonance frequencies under action of the oscillation core circuit 200, and output a fundamental signal of one resonance frequency. The voltage controlled oscillation device 10 provided in this embodiment controls the switch circuit 300 to be turned on/off by using the control device 400, so that the resonator 100 retains two resonance frequencies from a plurality of different resonance frequencies. Furthermore, the control device 400 controls the switch circuit 300 to be turned on/off, so that the two resonance frequencies retained by the resonator 100 can be changed, thereby improving the tuning range of the resonator 100. Meanwhile, under action of oscillation core circuit 200, the resonance frequency corresponding to the high order harmonic wave is suppressed based on the transmission characteristic of the resonator 100, so that the resonance frequency at the high order harmonic wave in the output signal passing through the resonator 100 is suppressed, and only the resonance frequency at the fundamental wave is retained, thereby reducing the phase noise of the signal output through the resonator 100. Furthermore, the negative impedance is generated by the oscillation core circuit 200, and thus the impedance generated by the resonator 100 can be counteracted, thereby ensuring that a stable oscillation signal can be output through the resonator 100.

Figure 2:
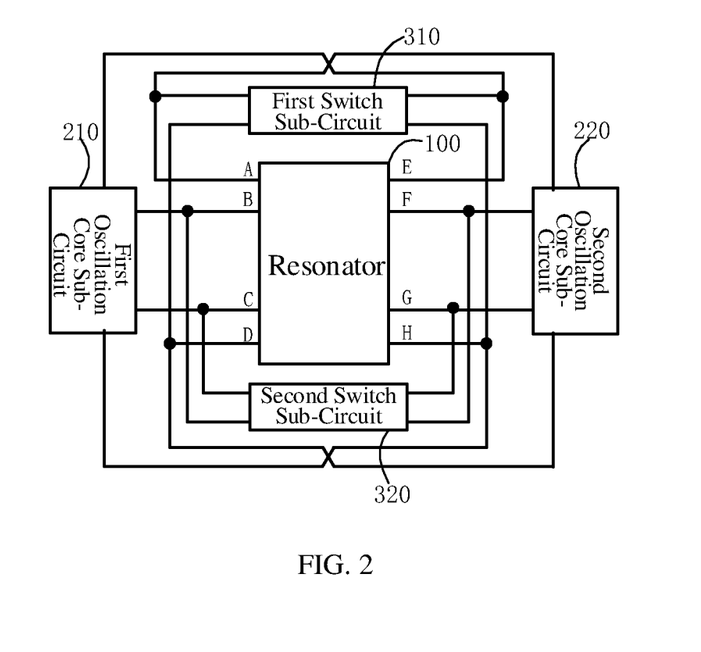
FIG. 2 is a schematic structural diagram illustrating a voltage controlled oscillation device according to an embodiment of the present disclosure.

Referring to FIG. 2, in an embodiment, the oscillation core circuit 200 includes a first oscillation core sub-circuit 210 and a second oscillation core sub-circuit 220.

A first end of the first oscillation core sub-circuit 210 is connected to a first input end of the resonator 100, a second output end of the first oscillation core sub-circuit 210 is connected to a second input end of the resonator 100, a first input end of the first oscillation core sub-circuit 210 is connected to a first output end of the resonator 100, and a second input end of the first oscillation core sub-circuit 210 is connected to a second output end of the resonator 100. The first output end of the first oscillation core sub-circuit 210 serves as the first output end of the oscillation core circuit 200 and is connected to the first input end of the resonator 100. The second output end of the first oscillation core sub-circuit 210 serves as the second output end of the oscillation core circuit 200 and is connected to the second input end of the resonator 100. A first input end of the first oscillation core sub-circuit 210 serves as a first input end of the oscillation core circuit 200 and is connected to a first output end of the resonator 100. A second input end of the first oscillation core sub-circuit 210 serves as a second input end of the oscillation core circuit 200 and is connected to a second output of the resonator 100. The phases of the signals output by the first output end of the first oscillation core sub-circuit 210 and the second output end of the first oscillation core sub-circuit 210 are inverted, the phases of the signals output by the first output end of the first oscillation core sub-circuit 210 and the second input end of the first oscillation core sub-circuit 210 are inverted, and the phases of the signals output by the second output end of the first oscillation core sub-circuit 210 and the first input end of the first oscillation core sub-circuit 210 are inverted.

The first oscillation core sub-circuit 210 provides signals of different phases to the resonator 100 through the first output end and the second output end, and the structure of the first oscillation core sub-circuit 210 is not limited this embodiment as long as the function thereof can be realized.

Figure 3:
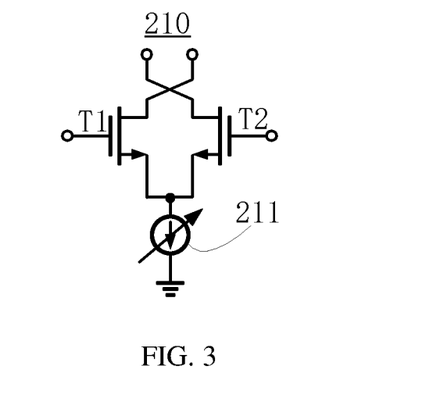
FIG. 3 is a schematic structural diagram illustrating a first oscillation core sub-circuit according to an embodiment of the present disclosure.

Referring to FIG. 3, in an embodiment, the first oscillation core sub-circuit 210 includes a current source 211, a field effect transistor T1 and a field effect transistor T2. A first end of the current source 211 is grounded, a gate of the field effect transistor T1 is connected to a first output end of the resonator 100, a source of the field effect transistor T1 is connected to a second end of the current source 211, and a drain of the field effect transistor T1 is connected to the first input end of the resonator 100. A gate of the field effect transistor T2 is connected to the second output end of the resonator 100, a source of the field effect transistor T2 is connected to the second end of the current source 211, and a drain of the field effect transistor T2 is connected to the second input end of the resonator 100.

The gate of the field effect transistor T1 serves as the first input end of the first oscillation core sub-circuit 210 and is connected to the first output end of the resonator 100, and the drain of the field effect transistor T1 serves as the first output end of the first oscillation core sub-circuit 210 and is connected to the first input end of the resonator 100. The gate of the field effect transistor T2 serves as the second input end of the first oscillation core sub-circuit 210 and is connected to the second output end of the resonator 100, and the drain of the field effect transistor T2 serves as the second output end of the first oscillation core sub-circuit 210 and is connected to the second input end of the resonator 100. The current source 211 is controllable, that is, a user can control the current output by the current source 211 according to the actual application. In this embodiment, the power consumption of the resonator 100 can be reduced by the controllable current source 211, and the phase noise of the signal output by the resonator 100 can be reduced. Meanwhile, the cross-coupled field effect transistors T1 and T2 may generate a negative impedance to counteract the impedance generated by the resonator 100, thereby ensuring that a stable resonance signal can be output through the resonator 100. In an embodiment, the field effect transistor T1 and the field effect transistor T2 are both N-channel field effect transistors.

A first output end of the second oscillation core sub-circuit 220 is connected to a third input end of the resonator 100, a second output end of the second oscillation core sub-circuit 220 is connected to a fourth input end of the resonator 100, a first input end of the second oscillation core sub-circuit 220 is connected to a third output end of the resonator 100, and a second input end of the second oscillation core sub-circuit 220 is connected to a fourth output end of the resonator 100. The first output end of the second oscillation core sub-circuit 220 serves as the third output end of the oscillation core circuit 200 and is connected to the third input end of the resonator 100. The second output end of the second oscillation core sub-circuit 220 serves as the fourth output end of the oscillation core circuit 200 and is connected to the fourth input end of the resonator 100. The first input end of the second oscillation core sub-circuit 220 as the third input end of the oscillation core circuit 200 and is connected to the third output end of the resonator 100. The second output end of the second oscillation core sub-circuit 220 serves as the fourth input end of the oscillation core circuit 200 and is connected to the fourth output end of the resonator 100. The second oscillation core sub-circuit 220 and the first oscillation core sub-circuit 210 may be the same or different, and the detailed description of the second oscillation core sub-circuit 220 may be referred to the description of the first oscillation core sub-circuit 210, which is not described herein again. In a specific embodiment, by operating the two oscillation core sub-circuits operate simultaneously, the phase noise of the signal output by the resonator 100 is reduced by 3 dB.

Figure 4:
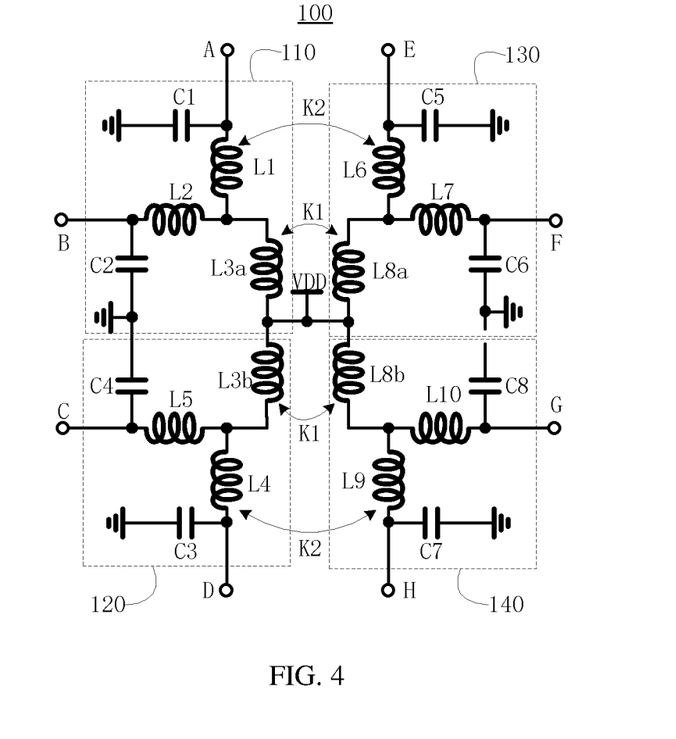
FIG. 4 is a schematic structural diagram illustrating a resonator according to an embodiment of the present disclosure.

Referring to FIG. 4, in an embodiment, the resonator 100 includes a first resonance circuit 110, a second resonance circuit 120, a third resonance circuit 130, and a fourth resonance circuit 140.

A first end of the first resonance circuit 110 is connected to a first input end of the second oscillation core sub-circuit 210, a second end of the first resonance circuit 110 is connected to a first output end of the first oscillation core sub-circuit 210, and a third end of the first resonance circuit 110 is configured to be connected to a power supply. A circuit formed by an inductor and a capacitor, which can generate a resonance phenomenon at one or more frequencies, is collectively referred to as the resonance circuit. The resonance circuit may be classified into a series resonance circuit and a parallel resonance circuit. The first resonance circuit 110 may be an LC oscillation circuit, and the specific structure of the first resonance circuit 110 is not limited in this embodiment, as long as the function thereof can be realized.

Continuously referring to FIG. 4, in an embodiment, the first resonance circuit 110 includes an inductor L1, an inductor L2, an inductor L3a, a capacitor C1, and a capacitor C2. A first end of the inductor L1 is connected to a first input end of the second oscillation core sub-circuit 220. A first end of the inductor L2 is connected to a first output end of the first oscillation core sub-circuit 210, and a second end of the inductor L2 is connected to a second end of the inductor L1. A first end of the inductor L3a is connected to a second end of the inductor L2, and a second end of the inductor L3a is configured to be connected to the power supply. The first end of the capacitor C1 is connected to the first end of the inductor L1, and the second end of the capacitor C1 is grounded. A first end of the capacitor C2 is connected to a first end of the inductor L2, and a second end of the capacitor C2 is grounded.

The first end of the inductor L1 serves as the first end of the first resonance circuit 110 and is connected to the first input end of the second oscillation core sub-circuit 220. The first end of the inductor L2 serves as the second end of the first resonance circuit 110 and is connected to the first output end of the first oscillation core sub-circuit 210. The inductor L1 and the capacitor C2 form an LC parallel resonance circuit, and the inductor L2 and the capacitor C2 form another LC parallel resonance circuit. In this embodiment, the specific values of the inductor L1, the inductor L2, the inductor L3a, the capacitor C1 and the capacitor C2 are not limited, and the user may set the values of the inductor L1, the inductor L2, the inductor L3a, the capacitor C1 and the capacitor C2 according to the required resonance frequency.

A first end of the second resonance circuit 120 is connected to the second input end of the second oscillation core sub-circuit 220, and a second end of the second resonance circuit 120 is connected to the second output end of the first oscillation core sub-circuit 210. The structure of the second resonance circuit 120 is the same as that of the first resonance circuit 110. For the specific description of the second resonance circuit 120, reference may be made to the description of the first resonance circuit 110, and details are not described herein again.

Continuously referring to FIG. 4, in an embodiment, the second resonance circuit 120 includes an inductor L4, an inductor L5, an inductor L3b, a capacitor C3, and a capacitor C4. A first end of the inductor L4 is connected to the second input end of the second oscillation core sub-circuit 220, a second end of the inductor L4 is connected to a first end of the inductor L3b, and a second end of the inductor L3b is configured to be connected to the power supply. A first end of the inductor L5 is connected to a second end of the inductor L4, and a second end of the inductor L5 is connected to the second output end of the first oscillation core sub-circuit 210. A first end of the capacitor C3 is connected to the first end of the inductor L4, and a second end of the capacitor C3 is grounded. A first end of the capacitor C4 is connected to the second end of the inductor L5, and a second end of the capacitor C4 is grounded.

The first end of the inductor L4 serves as the first end of the second resonance circuit 120 and is connected to the second input end of the second oscillation core sub-circuit 220. The second end of the inductor L5 serves as the second end of the second resonance circuit 120 and is connected to the second output end of the first oscillation core sub-circuit 220. The capacitor C3 of the inductor L4 forms an LC parallel resonance circuit, and the inductor L5 and the capacitor C5 form another LC parallel resonance circuit. In this embodiment, the specific values of the inductor L4, the inductor L5, the inductor L3b, the capacitor C3 and the capacitor C4 are not limited, and the user may set the values of the inductor L4, the inductor L5, the inductor L3b, the capacitor C3 and the capacitor C4 according to the required resonance frequency.

A first end of the third resonance circuit 130 is connected to the first input end of the first oscillation core sub-circuit 210, a second end of the third resonance circuit 130 is connected to the first output end of the second oscillation core sub-circuit 220, and a third end of the third resonance circuit 130 is configured to be connected to the power supply. The structure of the third resonance circuit 130 is the same as the structure of the first resonance circuit 110. For the detailed description of the third resonance circuit 130, reference may be made to the description of the first resonance circuit 110, and details are not described herein again.

Continuously referring to FIG. 4, in an embodiment, the third resonance circuit 130 includes an inductor L6, an inductor L7, an inductor L8a, a capacitor C5, and a capacitor C6. A first end of the inductor L6 is connected to the first input end of the first oscillation core sub-circuit 210. A first end of the inductor L7 is connected to the first output end of the second oscillation core sub-circuit 220, and a second end of the inductor L7 is connected to a second end of the inductor L6. A first end of the inductor L8a is connected to the second end of the inductor L7, and a second end of the inductor L8a is configured to be connected to the power supply. A first end of the capacitor C5 is connected to the first end of the inductor L6, and a second end of the capacitor C5 is grounded. A first end of the capacitor C6 is connected to the first end of the inductor L7, and a second end of the capacitor C6 is grounded.

The first end of the inductor L6 serves as the first end of the third resonance circuit 130 and is connected to the first output end of the first oscillation core sub-circuit 210, and the first end of the inductor L7 serves as the second end of the third resonance circuit 130 and is connected to the first output end of the second oscillation core sub-circuit 220. The capacitor C5 and the inductor L6 form an LC parallel resonance circuit. The inductor L7 and the capacitor C6 form another LC parallel resonance circuit. The inductor L6 and the inductor L1 are coupled to each other, and the coupling coefficient is K2. The inductor L8a and the inductor L3a are coupled to each other, and the coupling coefficient is K1. In this embodiment, the specific values of the inductor L6, the inductor L7, the inductor L8a, the capacitor C5 and the capacitor C6 are not limited, and the user may set the values of the inductor L6, the inductor L7, the inductor L8a, the capacitor C5 and the capacitor C6 according to the required resonance frequency.

A first end of the fourth resonance circuit 140 is connected to the second output end of the first oscillation core sub-circuit 210, and a second end of the fourth resonance circuit 140 is connected to the second output end of the second oscillation core sub-circuit 220. The structure of the fourth resonance circuit 140 is the same as that of the second resonance circuit 120. For the detailed description of the fourth resonance circuit 140, reference may be made to the description of the second resonance circuit 120, and details are not described herein again.

Continuously referring to FIG. 4, in an embodiment, the fourth resonance circuit 140 includes an inductor L8, an inductor L10, an inductor L8, a capacitor C7, and a capacitor C8. A first end of the inductor L9 is connected to the second input end of the first oscillation core sub-circuit 210, a second end of the inductor L9 is connected to a first end of the inductor L8b, and a second end of the inductor L8b is configured to be connected to the power supply. A first end of the inductor L10 is connected to a second end of the inductor L9, and a second end of the inductor L10 is connected to the second output end of the second oscillation core sub-circuit 220. A first end of the capacitor C7 is connected to the first end of the inductor L9, and a second end of the capacitor C7 is grounded. A first end of the capacitor C8 is connected to the second end of the inductor L10, and a second end of the capacitor C8 is grounded.

Figure 5:
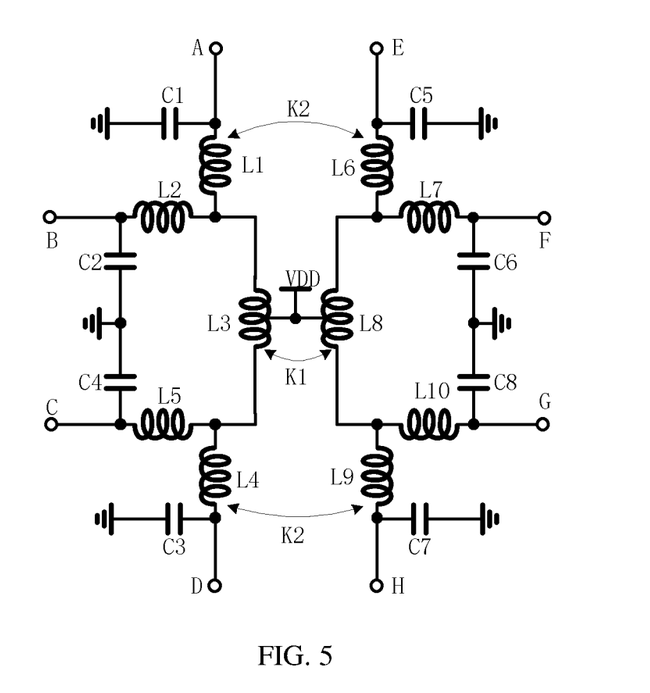
FIG. 5 is a schematic structural diagram illustrating a resonator according to an embodiment of the present disclosure.
Figure 6:
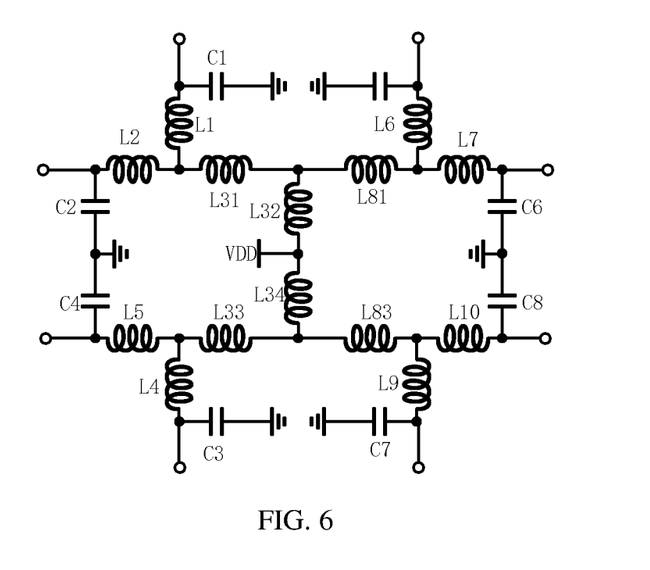
FIG. 6 is a schematic structural diagram illustrating a resonator according to an embodiment of the present disclosure.

The first end of the inductor L9 serves as the first end of the fourth resonance circuit 140 and is connected to the second input end of the first oscillation core sub-circuit 210, and the second end of the inductor L10 serves as the second end of the fourth resonance circuit 140 and is connected to the second output end of the second oscillation core sub-circuit 220. The inductor L9 and the capacitor C7 form an LC parallel resonance circuit, and the inductor L10 and the capacitor C8 form another LC parallel resonance circuit. The inductor L9 and the inductor L4 are coupled to each other, and the coupling coefficient is K2. The inductor L8b and the inductor L3b are coupled to each other, and the coupling coefficient is K1. In this embodiment, the specific values of the inductor L10, the inductor L10, the inductor L8b, the capacitor C7 and the capacitor C8 are not limited, and the user may set the values of the inductor L10, the inductor L10, the inductor L8b, the capacitor C7 and the capacitor C8 according to the required resonance frequency. In a specific embodiment, according to an inductance equivalent relationship, the resonance circuit shown in FIG. 4 may be equivalent to the resonance circuit shown in FIG. 5 or equivalent to the resonance circuit shown in FIG. 6.

In this embodiment, the oscillation core circuit 200 provides energy and phases to the first resonance circuit 110, the second resonance circuit 120, the third resonance circuit 130, and the fourth resonance circuit 140, so that each resonance circuit oscillates at four resonance frequencies, thereby increasing the tuning range of the voltage controlled oscillation device 10. Furthermore, in this embodiment, each resonance circuit has a simple structure and a close connection, so that the formed resonator 100 has a small area.

Continuously referring to FIG. 2, in an embodiment, the switch circuit 300 includes a first switch sub-circuit 310 and a second switch sub-circuit 320. Each switch sub-circuit includes two input ends and two output ends.

A first input end of the first switch sub-circuit 310 is connected to the third output end of the resonator 100, a second input end of the first switch sub-circuit 310 is connected to the fourth output end of the resonator 100, a first output end of the first switch sub-circuit 310 is connected to the first output end of the resonator 100, a second output end of the first switch sub-circuit 310 is connected to the second output end of the resonator 100, and a control end of the first switch sub-circuit 310 is connected to the control device 400.

Figure 7:
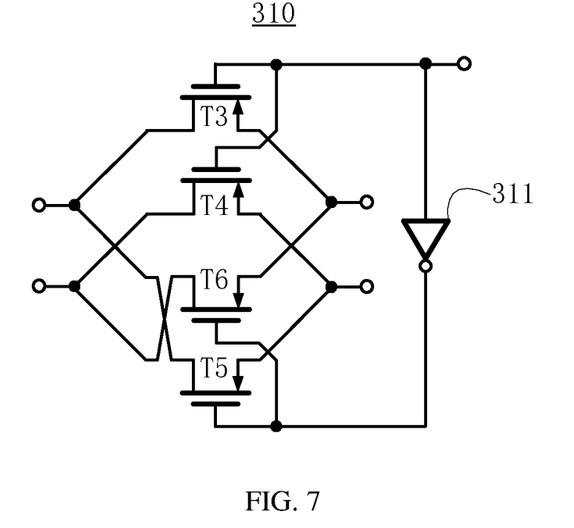
FIG. 7 is a schematic structural diagram illustrating a first switch sub-circuit according to an embodiment of the present disclosure.

Referring to FIG. 7, in an embodiment, the first switch sub-circuit 310 includes a field effect transistor T3, a field effect transistor T4, an inverter 311, a field effect transistor T5, and a field effect transistor T6.

A gate of the field effect transistor T3 is connected to the control device 400, the drain of the field effect transistor T3 is connected to the third output end of the resonator 100, and a source of the field effect transistor T3 is connected to the first output end of the resonator 100. A gate of the field effect transistor T4 is connected to the control device 400, a drain of the field effect transistor T4 is connected to the fourth output end of the resonator 100, and a source of the field effect transistor T4 is connected to the second output end of the resonator 100. An input end of the inverter 311 is connected to the control device 400. A gate of the field effect transistor T5 is connected to an output end of the inverter 311, a drain of the field effect transistor T5 is connected to the third output end of the resonator 100, and a source of the field effect transistor T5 is connected to the second output end of the resonator 100. A gate of the field effect transistor T6 is connected to the output end of the inverter 311, a drain of the field effect transistor T6 is connected to the fourth output end of the resonator 100, and a source of the field effect transistor T6 is connected to the first output end of the resonator 100.

In this embodiment, the types of the field effect transistor T3, the field effect transistor T4, the field effect transistor T5 and the field effect transistor T6 are the same, that is, the field effect transistor T3, the field effect transistor T4, the field effect transistor T5 and the field effect transistor T6 are all P-channel field effect transistors. The inverter 311 is a device that can invert the phase of the output signal by 180 degrees. That is, if the control signal output by the control device 400 can turn on the field effect transistor T3 and the field effect transistor T4, the control signal will turn off the field effect transistor T5 and the field effect transistor T6 after passing through the inverter 311. The inverter 311 may be constituted by a typical TTL and NOT gate circuit, and may also be constituted by two enhanced MOS field effect transistors. The specific structure of the inverter 311 is not limited in this embodiment as long as the function thereof can be realized.

In an embodiment, the field effect transistor T3, the field effect transistor T4, the field effect transistor T5 and the field effect transistor T6 are all P-channel field effect transistors. When the control signal output by the control device 400 is a low level signal, the field effect transistor T3 and the field effect transistor T4 are turned on, and the field effect transistor T5 and the field effect transistor T6 are turned off. That is, the third output end of the resonator 100 is connected to the first output end of the resonator 100, the fourth output end of the resonator 100 is connected to the second output end of the resonator 100, the third output end of the resonator 100 is disconnected with the second output end of the resonator 100, and the fourth output end of the resonator 100 is disconnected with the first output end of the resonator 100. Accordingly, the phrase of the signal output by the third output end of the resonator 100 is the same as the phrase of the signal output by the first output end of the resonator 100, and the phrase of the signal output by the fourth output end of the resonator is the same as the phrase of the signal output by the second output end of the resonator 100. In this embodiment, the types of the field effect transistors in the first switch sub-circuit 310 are the same and need not be distinguished, so that connection errors can be avoided.

A first input end of the second switch sub-circuit 320 is connected to the first input end of the resonator 100, a second input end of the second switch sub-circuit 320 is connected to the second input end of the resonator 100, a second output end of the second switch sub-circuit 320 is connected to the third input end of the resonator 100, a second output end of the second switch sub-circuit 320 is connected to the fourth input end of the resonator 100, and a control end of the second switch sub-circuit 320 is connected to the control device 400. The structure of the second switch sub-circuit 320 and the structure of the first switch sub-circuit 310 may be the same or different. For the specific description of the second switch sub-circuit 320, reference may be made to the foregoing description of the first switch sub-circuit 310, and details are not described herein again.

According to another embodiment of the present disclosure, a wireless transceiver is provided, which includes the voltage controlled oscillation device 10 provided by the above embodiment. The wireless transceiver may include a transmitter and a receiver. The voltage controlled oscillation device 10 when used in the transmitter can help the radio frequency (RF) part of the transmitter to modulate the baseband signal to a higher frequency, i.e., to up-convert the frequency of the baseband signal to a specific frequency. The voltage controlled oscillation device 10 when used in the receiver can help the receiver to down-convert the received signal to a specific frequency band. Since the wireless transceiver includes the voltage controlled oscillation device 10, the wireless transceiver has all the structure and benefits of the voltage controlled oscillation device 10.

The working principle of the voltage controlled oscillation device of the present disclosure will be explained below from a specific embodiment. In this specific embodiment, the first end and the second end of the first resonance circuit are respectively referred to as an A end and a B end, the first end and the second end of the second resonance circuit are respectively referred to as a D end and a C end, the first end and the second end of the third resonance circuit are respectively referred to as an E end and an F end, and the first end and the second end of the fourth resonance circuit are respectively referred to as an H end and a G end. The inductor L3a in the first resonance circuit and the inductor L8a in the third resonance circuit are coupled to each other, with a coupling coefficient of K1, and the inductance values of the inductor L3a and inductor L8a are both $L_1(1+K1)/2$. The inductor L1 in the first resonance circuit and the inductor L6 in the third resonance circuit are coupled to each other, with a coupling coefficient of K2, and the inductance values of the inductor L1 and the inductor L6 are both $L_2$. The inductor L3b in the second resonance circuit and the inductor L8b in the fourth resonance circuit are coupled to each other, with a coupling coefficient of K1, the inductance values of the inductor L3b and the inductor L8b are both $L_1(1+K1)/2$. The inductor L4 in the second resonance circuit and the inductor L9 in the fourth resonance circuit are coupled to each other, with a coupling coefficient of K2, and the inductance values of the inductor L4 and the inductor L9 are both $L_2$. The inductance values of the other inductors in the resonator are all $L_2$, and the capacitance values of the capacitors are all C. The first switch sub-circuit is denoted as SW1, and the second switch sub-circuit is denoted as SW2. It is assumed that the types of field effect transistors in the switch sub-circuits are all the same, all being on at a low level. The low lever is denoted as "0", and the high level is denoted as "1". As shown in FIG. 4, the resonator has four resonance frequencies when viewed from the AD or BC or EH or FG ends. Under action of the switch circuit, the two resonance frequencies thereof are suppressed, and the remaining two resonance frequencies are retained. Under action of the oscillation core circuit, the high order resonance frequency of the retained resonance frequencies is suppressed, and the specific analysis is as follows.

Figure 8:
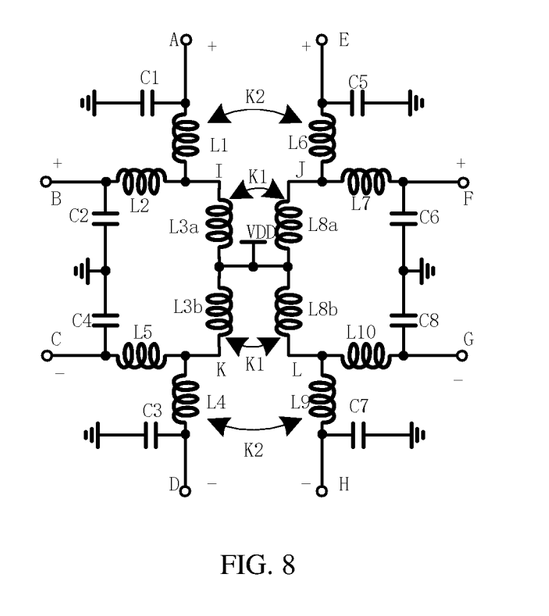
FIG. 8 is a schematic structural diagram illustrating a resonator according to an embodiment of the present disclosure.
Figure 9:
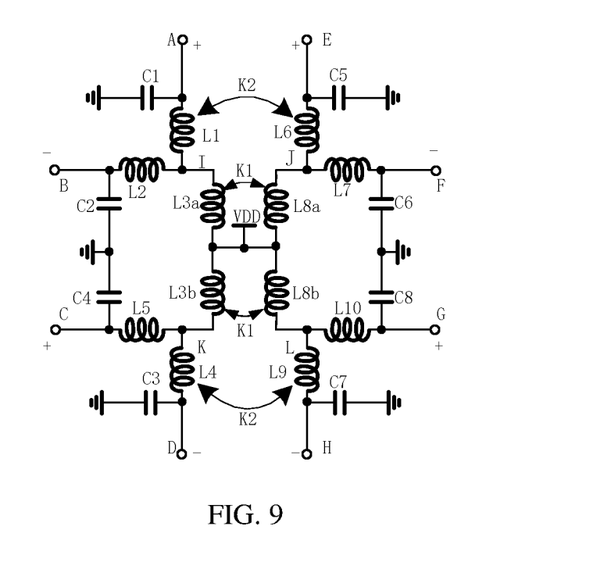
FIG. 9 is a schematic structural diagram illustrating a resonator according to an embodiment of the present disclosure.

(1) When SW1=0 and SW2=0, the A end and the E end in the resonator are connected, the D end and the H end are connected, the B end and the F end are connected, and the C end and the G end are connected. In this case, signals output at the A end and the E end are in a same phase, signals output at the D end and the H end are in a same phase, signals output at the B end and the F end are in a same phase, and signals output at the C end and the G end are in a same phase, and there are two specific phase diagrams as shown in FIG. 8 and FIG. 9. In this case, the resonator retains two resonance frequencies. In other words, the resonator resonates at the fundamental wave and the high order harmonic wave at the same time. The resonance frequency at the fundamental wave is less than the resonance frequency at the high order harmonic wave. In the phase case shown in FIG. 8, the resonance frequency of the resonator is $f_1$, and in the phase case shown in FIG. 9, the resonance frequency of the resonator is $f_3$. $f_1$ is less than $f_3$. Since the signal output at the first output end of the first oscillation core sub-circuit and the signal output at the second input end of the first oscillation core sub-circuit are in inverted phrases, and the signal output at the second output end of the first oscillation core sub-circuit and the signal output at the first input end of the first oscillation core sub-circuit are in inverted phrases, signals output at the B end and the H end of the resonator are in inverted phrases, and signals output at the C end and the E end are in inverted phrases. Under action of the oscillation core circuit, the phase diagram of the resonator is shown in FIG. 8, and the resonance frequency of the resonator is $f_1$. That is, under action of the oscillation core circuit, the resonance frequency $f_3$ at the high order harmonic wave is suppressed according to the transmission characteristic of the resonator itself, and the resonance frequency $f_1$ at the fundamental wave is retained, thereby reducing the phase noise of the output signal and outputting a fundamental signal at one resonance frequency.

Figure 10:
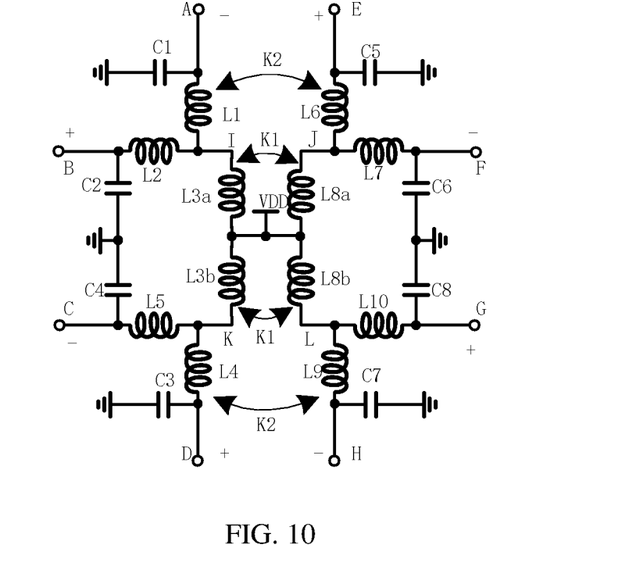
FIG. 10 is a schematic structural diagram illustrating a resonator according to an embodiment of the present disclosure.
Figure 11:
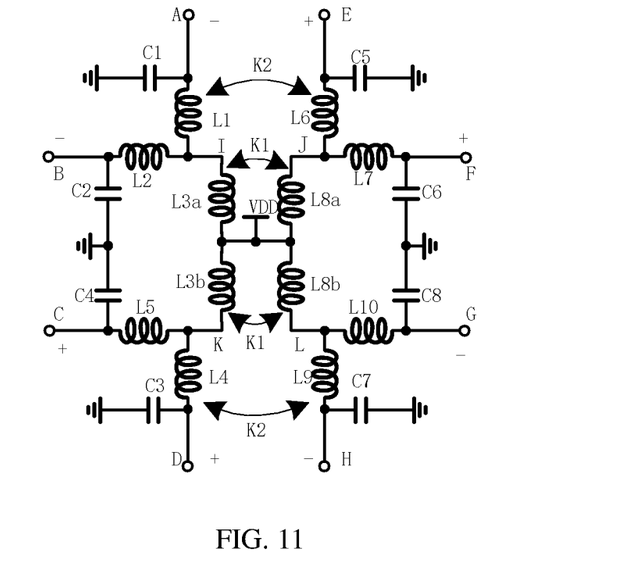
FIG. 11 is a schematic structural diagram illustrating a resonator according to an embodiment of the present disclosure.

(2) When SW1=1 and SW2=1, the A end and the H end in the resonator are connected, the D end and the E end are connected, the B end and the G end are connected, and the C end and the F end are connected. In this case, signals output at the A end and the H end are in a same phase, signals output at the D end and the E end are in a same phase, signals output at the B end and the G end are in a same phase, and signals output at the C end and the F end are in a same phase, and there are two specific phase diagrams as shown in FIG. 10 and FIG. 11. In this case, the resonator retains two resonance frequencies. In other words, the resonator resonates at the fundamental wave and the high order harmonic wave at the same time. The resonance frequency at the fundamental wave is less than the resonance frequency at the high order harmonic wave. In the phase case shown in FIG. 10, the resonance frequency of the resonator is $f_2$, and in the phase case shown in FIG. 9, the resonance frequency of the resonator is $f_4$. $f_2$ is less than $f_4$. Since the signal output at the first output end of the first oscillation core sub-circuit and the signal output at the second input end of the first oscillation core sub-circuit are in inverted phrases, and the signal output at the second output end of the first oscillation core sub-circuit and the signal output at the first input end of the first oscillation core sub-circuit are in inverted phrases, signals output at the B end and the H end of the resonator are in inverted phrases, and signals output at the C end and the E end are in inverted phrases. Under action of the oscillation core circuit, the phase diagram of the resonator is shown in FIG. 10, and the resonance frequency of the resonator is $f_2$. That is, under action of the oscillation core circuit, the resonance frequency $f_4$ at the high order harmonic wave is suppressed according to the transmission characteristic of the resonator itself, and the resonance frequency $f_2$ at the fundamental wave is retained, thereby reducing the phase noise of the output signal and outputting a fundamental signal at one resonance frequency.

Figure 12:
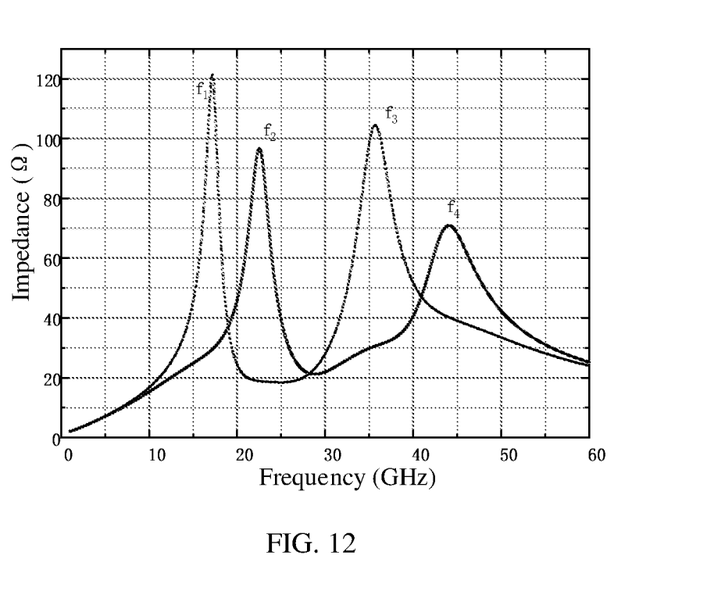
FIG. 12 is a schematic diagram illustrating a relationship between a frequency and a resonance peak according to an embodiment of the present disclosure.
Figure 13:
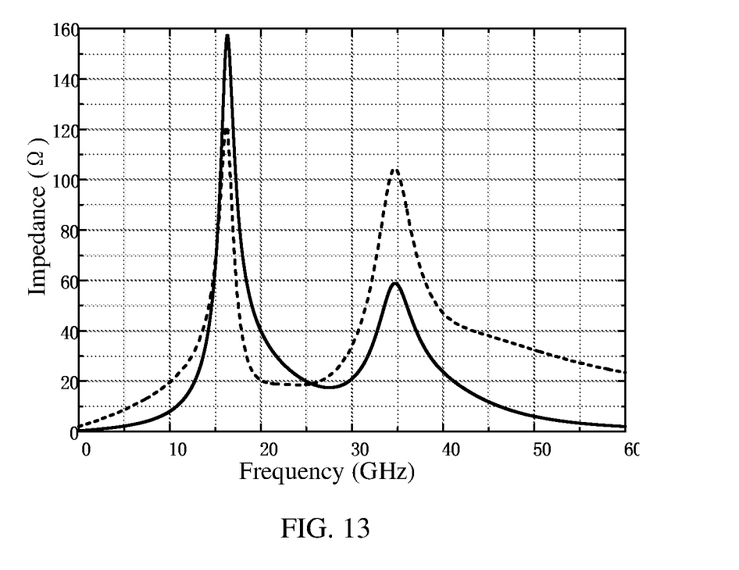
FIG. 13 is a schematic diagram illustrating a relationship between a frequency and a resonance peak according to an embodiment of the present disclosure.

Through the above analysis, under action of the switch circuit, the resonator can resonate simultaneously at two frequencies, and the generated resonance peak is shown in FIG. 12. The solid line represents the relationship between the frequency and the resonance peak when SW1=1 and SW2=1, while the dotted line represents the relationship between the frequency and the resonance peak when SW1=0 and SW2=0. The resonance peak represents the impedance of the resonator. Under action of oscillation core circuit, the high order resonance can be suppressed according to the transmission characteristic of the resonator itself, and the fundamental wave is retained. The specific schematic diagram of the resonance peak is shown in FIG. 13. The solid line represents a resonance peak where the resonance frequency at the high order harmonic wave is suppressed and only the resonance frequency at the fundamental wave is retained, while the dotted line represents the resonance peak where the resonance frequency at the high order harmonic wave is not suppressed.

In a specific embodiment, considering the coupling relationship between the inductor L1 and the inductor L2, between the inductor L4 and the inductor L5, between the inductor L6 and the inductor L7, and between the inductor L9 and the inductor L10, the flexibility of adjusting the resonance frequency of the resonator can be increased.

The respective technical features of the above embodiments can be combined arbitrarily, and in order to brief the description, not all possible combinations of the respective technical features in the above embodiments are described; however, as long as the combination of these technical features does not have any contradiction, it should be considered to be the scope of disclosure disclosed in the present description.

The above embodiments merely express several embodiments of the present disclosure, and the description thereof is more specific and detailed, but cannot be construed as limiting the scope of the present disclosure. It should be noted that, for a person of ordinary skill in the art, several modifications and improvements can also be made without departing from the concept of the present disclosure, which all belong to the scope of protection of the present disclosure. Therefore, the scope of protection of the present disclosure should be regarded by the appended claims.

What is claimed is:

1. A voltage controlled oscillation device, comprising:
  a resonator adapted to generate resonance frequencies;
  an oscillation core circuit adapted to provide signals of different phases to the resonator, wherein the oscillation core circuit includes:
    a first oscillation core sub-circuit having a first first oscillation core sub-circuit output end coupled to a first resonator input end, a second first oscillation core sub-circuit output end coupled to a second resonator input end, a first first oscillation core sub-circuit input end coupled to a first resonator output end, and a second first oscillation core sub-circuit input end coupled to a second resonator output end; and
    a second oscillation core sub-circuit having a first second oscillation core sub-circuit output end coupled to a third resonator input end, a second second oscillation core sub-circuit output end coupled to a fourth resonator input end, a first second oscillation core sub-circuit input end coupled to a third resonator output end, and a second second oscillation core sub-circuit input end coupled to a fourth resonator output end;
  a switch circuit; and
  a control device adapted to control connection and disconnection among the first, second, third, and fourth resonator input and output ends by controlling the switch circuit to be turned on and off, so that the resonator retains two resonance frequencies from the generated resonance frequencies, wherein the control device is adapted to change the two resonance frequencies by controlling the switch circuit to be turned on and off, wherein the resonator is adapted to process the two resonance frequencies using the oscillation core circuit, and output a fundamental signal of one resonance frequency, and wherein the first oscillation core sub-circuit includes:
- a current source having a first current source end that is grounded;
- a first field effect transistor having a first field effect transistor gate coupled to the first resonator output end, a first field effect transistor source coupled to a second current source end, and a first field effect transistor drain coupled to the first resonator input end; and
- a second field effect transistor having a second field effect transistor gate coupled to the second resonator output end, a second field effect transistor source coupled to the second current source end, and a second field effect transistor drain coupled to the second resonator input end.

2. The voltage controlled oscillation device according to claim 1, wherein the first and second field effect transistors are both N-channel field effect transistors.

3. The voltage controlled oscillation device according to claim 1, wherein the resonator includes:
- a first resonance circuit having a first first resonance circuit end coupled to the first second oscillation core sub-circuit input end, a second first resonance circuit end coupled to the first first oscillation core sub-circuit output end, and a third first resonance circuit end adapted to be coupled to a power supply;
- a second resonance circuit having a first second resonance circuit end coupled to the second second oscillation core sub-circuit input end, a second second resonance circuit end coupled to the second first oscillation core sub-circuit output end, and a third second resonance circuit end adapted to be coupled to the power supply;
- a third resonance circuit having a first third resonance circuit end coupled to the first first oscillation core sub-circuit input end, a second third resonance circuit end coupled to the first second oscillation core sub-circuit output end, and a third third resonance circuit end adapted to be coupled to the power supply; and
- a fourth resonance circuit having a first fourth resonance circuit end coupled to the second first oscillation core sub-circuit input end, a second fourth resonance circuit end coupled to the second second oscillation core sub-circuit output end, and a third fourth resonance circuit end adapted to be coupled to the power supply.

4. The voltage controlled oscillation device according to claim 3, wherein the first resonance circuit includes:
- a first inductor having a first first inductor end coupled to the first second oscillation core sub-circuit input end;
- a second inductor having a first second inductor end coupled to the first first oscillation core sub-circuit output end, and a second second inductor end coupled to a first first inductor end;
- a third inductor having a first third inductor end coupled to the second second inductor end, and a second third inductor end adapted to be coupled to the power supply;
- a first capacitor having a first first capacitor end coupled to the first first inductor end, and a second first capacitor end that is grounded; and
- a second capacitor having a first second capacitor end coupled to the first second inductor end, and a second second capacitor end that is grounded.

5. The voltage controlled oscillation device according to claim 1, wherein the switch circuit includes:
- a first switch sub-circuit having a first first switch sub-circuit input end coupled to a third resonator output end, a second first switch sub-circuit input end coupled to a fourth resonator output end, a first first switch sub-circuit output end coupled to a first resonator output end, a second first switch sub-circuit output end coupled to a second resonator output end, and a first switch sub-circuit control end coupled to the control device; and
- a second switch sub-circuit having a first second switch sub-circuit input end coupled to a first resonator input end, a second second switch sub-circuit input end coupled to a second resonator input end, a second second switch sub-circuit output end coupled to a third resonator input end, a second second switch sub-circuit output end coupled to a fourth resonator input end, and a second switch sub-circuit control end coupled to the control device.

6. The voltage controlled oscillation device according to claim 5, wherein the first switch sub-circuit includes:
- a third field effect transistor having a third field effect transistor gate coupled to the control device, a third field effect transistor drain coupled to the third resonator output end, and a third field effect transistor source coupled to the first resonator output end;
- a fourth field effect transistor having a fourth field effect transistor gate coupled to the control device, a fourth field effect transistor drain coupled to the fourth resonator output end, and a fourth field effect transistor source coupled to the resonator second output end;
- an inverter having an inverter input end coupled to the control device;
- a fifth field effect transistor having a fifth field effect transistor gate coupled to an inverter output end, a fifth field effect transistor drain coupled to the third resonator output end, and a fifth field effect transistor source coupled to the resonator second output end; and
- a sixth field effect transistor having a sixth field effect transistor gate coupled to the inverter output end, a sixth field effect transistor drain coupled to the fourth resonator output end, and a sixth field effect transistor source coupled to the first resonator output end.

7. The voltage controlled oscillation device according to claim 6, wherein the third field effect transistor, the fourth field effect transistor, the fifth field effect transistor and the sixth field effect transistor are all P-channel field effect transistors.

8. The voltage controlled oscillation device according to claim 1, wherein the first and second oscillation core sub-circuits have a same structure.

9. The voltage controlled oscillation device according to claim 4, wherein the first, second, third, and fourth resonance circuits have a same structure.

10. The voltage controlled oscillation device according to claim 6, wherein the first switch sub-circuit and the second switch sub-circuit have a same structure.

11. A wireless transceiver, comprising the voltage controlled oscillation device according to claim 1.

* * * * *